United States Patent [19]

Paski

[11] Patent Number: 4,599,526

[45] Date of Patent: Jul. 8, 1986

[54] CLOCKED LATCHING CIRCUIT

[75] Inventor: Robert M. Paski, Middletown, N.J.

[73] Assignee: AT&T Bell Laboratories, Murray Hill, N.J.

[21] Appl. No.: 495,062

[22] Filed: May 13, 1983

[51] Int. Cl.⁴ .......................... H03K 5/01; H03K 3/286
[52] U.S. Cl. .................................. 307/269; 307/288; 307/530
[58] Field of Search .................. 307/269, 272 A, 279, 307/288, 289, 530, 268

[56] References Cited

U.S. PATENT DOCUMENTS 3,728,560  4/1973  Treadway ........................... 307/289
4,258,273  3/1981  Straznicky et al. ............. 307/272 A

OTHER PUBLICATIONS

"A Single Chip Regenerator for Transmission Systems Operating in the Range 2-320 Mbits/S", *IEEE Jour. of Solid-State Circuits*, vol. SC-17, No. 3, Jun. 1982, pp. 553-558.

*Primary Examiner*—John Zazworsky
*Attorney, Agent, or Firm*—Richard B. Havill; Daniel D. Dubosky

[57] ABSTRACT

A digital latching circuit includes a quantizer having an input pair of emitter-coupled transistors connected with output transimpedance circuits. The quantizer is responsive to the state of an input signal applied to the input pair for producing from the output transimpedance circuits a quantized output signal. A feedback pair of emitter-coupled transistors is interposed between the outputs of the transimpedance circuits and the inputs to the transimpedance circuits. Current pulses are applied alternatively to the common emitter circuits of the input pair and the feedback pair of transistors for alternatively enabling the quantizing of the state of the input signal and the latching of that quantized state.

6 Claims, 4 Drawing Figures

CLOCKED LATCHING CIRCUIT

BACKGROUND OF THE INVENTION

This invention relates to a latching circuit which is described more particularly as a clocked latching circuit.

In the prior art, a digital latching circuit includes input and latching pairs of emitter-coupled transistors. The input and latching pairs of transistors are responsive to states of input signals representing data bits for producing output signals having the binary value of the input signals but controlled by a clock cycle. Pulses of current are applied alternately to the common emitter circuits of the input and output pairs for alternately quantizing the state of the input signal and latching that quantized state.

There are several problems with the prior art latching circuit. When more latches than one are cascaded, level shifting is required between those latches. Such level shifting circuitry reduces speed of operation and increases propagation delay. The prior art latching circuit also is slowed because it is biased near saturation. Additionally the prior art latching circuit is highly sensitive to supply voltage level.

SUMMARY OF THE INVENTION

These problems are overcome by a clocked latching circuit including a quantizer having an input pair of emitter-coupled transistors connected to output transimpedance circuits. The quantizer is responsive to the state of an input signal applied to the input pair for producing, from the output transimpedance circuits, a quantized output signal. A feedback pair of emitter-coupled transistors is interposed between the outputs of the transimpedance circuits and the inputs to the transimpedance circuits. Current pulses are applied alternatively to the common emitter circuits of the input pair of transistors and of the feedback pair of transistors for alternatively enabling the quantizing of the state of the input signal and the latching of that quantized state.

BRIEF DESCRIPTION OF THE DRAWING

A better understanding of the arrangement and operation of the invention may be derived by reading the following detailed description with reference to the drawing wherein.

DETAILED DESCRIPTION

Figure 1:
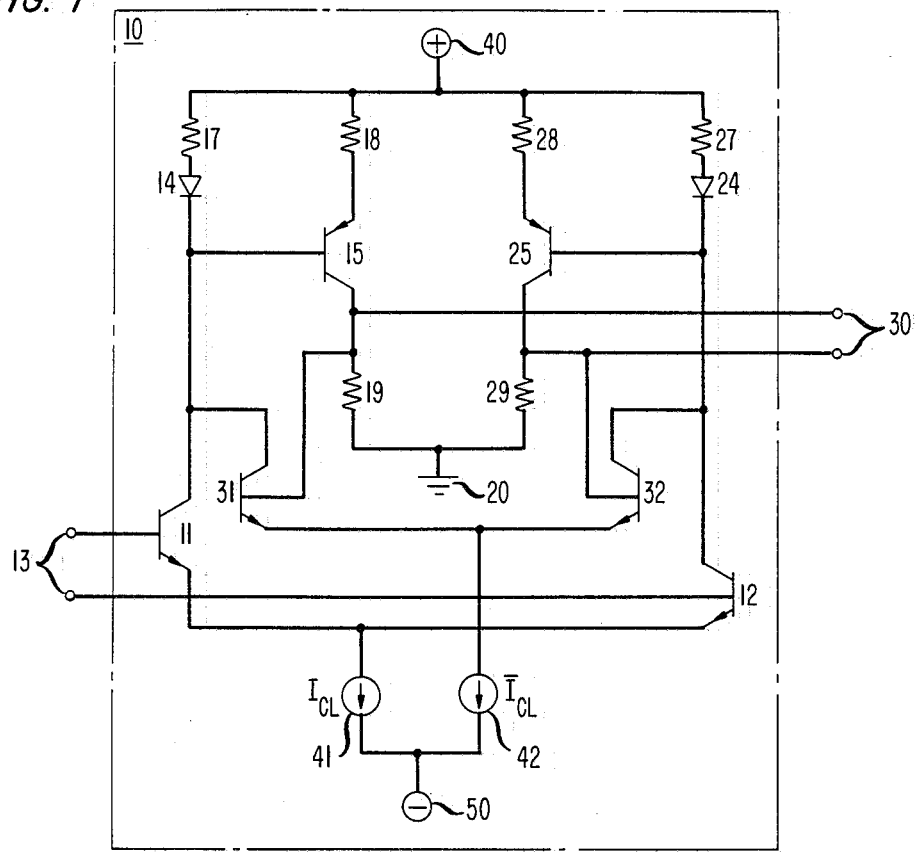
FIG. 1 is a schematic diagram of a clocked latching circuit.

Referring now to FIG. 1, there is shown a clocked latching circuit 10 including a quantizer having an input pair of emitter-coupled NPN transistors 11 and 12 and a pair of output transimpedance circuits. Balanced input data signals are applied to input terminals 13 which connect directly to base electrodes of the input pair of transistors 11 and 12.

A first transimpedance circuit, connected in the collector circuit of the transistor 11, includes a diode 14 and a PNP transistor 15 arranged with resistors 17 and 18 as a current mirror. A load resistor 19 is connected between the output collector electrode of the transistor 15 and ground potential 20.

A second transimpedance circuit, connected in the collector circuit of the transistor 12, includes a diode 24 and a PNP transistor 25 arranged with resistors 27 and 28 as another current mirror. A load resistor 29 is connected between the output collector electrode of the transistor 25 and ground potential 20.

It is noted that the first and second transimpedance circuits include the PNP transistors 15 and 25 which provide some valuable benefits during operation. By being opposite conductivity bype devices from the input pair of emitter-coupled NPN transistors 11 and 12, the transimpedance circuits avoid the use of level shifting devices which would slow down operation. Also because of the opposite conductivity type devices from the input pair, the base-collector junctions of the transistors of the transimpedance circuits float with respect to bias voltage as explained subsequently herein.

Output signals are produced on output terminals 30 which are connected with the collector electrodes of the transistors 15 and 25.

The circuit nodes connecting the output collector electrodes of the transistors 15 and 25 with the output terminals 30 also are connected with input base electrodes of a feedback pair of emitter-coupled NPN transistors 31 and 32. The output collector electrodes of the feedback pair of transistors 31 and 32 are connected, respectively, both to the collector electrodes of the input transistors 11 and 12 and to the input base electrodes of the transistors 15 and 25 of the transimpedance circuits.

A source 40 of positive polarity bias potential is connected to the resistors 17, 18, 27 and 28 in the transimpedance circuits. The input and feedback pairs of emitter-coupled transistors and the opposite conductivity type of transistors of the transimpedance circuits are interconnected so that the base-collector junctions of the feedback pair of transistors and of the transistors of the transimpedance circuits are floating with respect to bias voltage. Thus those transistors are biased so that output voltage signals produced by the opposite conductivity type transistors of the transimpedance circuits are independent of the bias voltage level over a wide range.

Common emitter circuits of the input pair of transistors 11 and 12 and of the feedback pair of transistors 31 and 32 are connected with complementary clock current sources 41 and 42, respectively. The clocked current sources 41 and 42 control operation of the latching circuit by controlling the common emitter current $I_{CL}$ conducted from the transistors 11 and 12 to a source 50 of negative polarity bias potential and the common emitter current $\bar{I}_{CL}$ conducted from the transistors 31 and 32 also to the source 50.

During operation there are three operating states which are determined by the clocked common emitter currents. Those states are an unlatched state, a dynamic state and a regenerative, or latching, state. Circuit functions which occur during each of these states are to be described subsequently.

Figure 2:
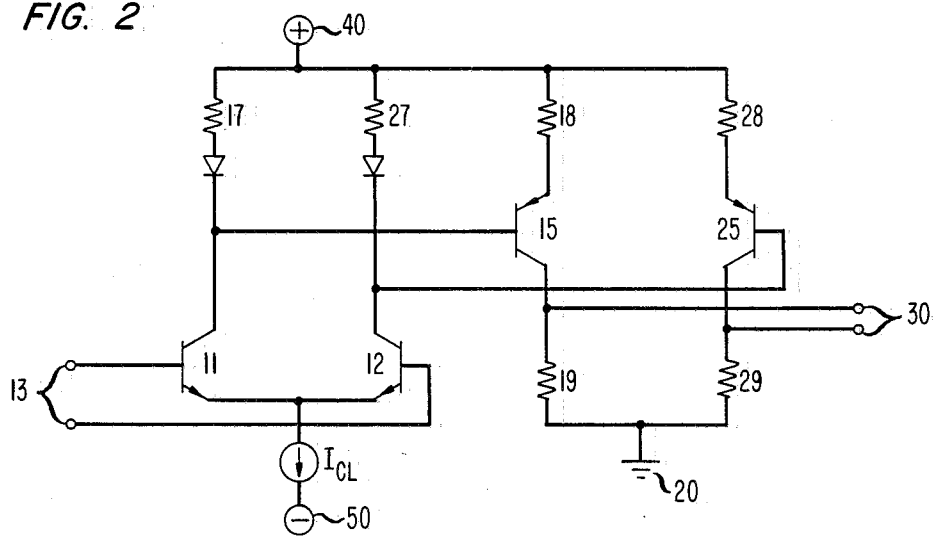
FIGS. 2, 3 and 4 are schematic diagrams of parts of the circuit of FIG. 1 during various operating conditions.

Referring now to FIG. 2, there is shown a schematic of the effective parts of the circuit of FIG. 1 during the unlatched state. The input pair of emitter-coupled transistors is separated from the transistors 15 and 25 for clarity. The unlatched state occurs when the clock current $I_{CL}$ has a maximum steady state magnitude while the complementary clock current signal $\bar{I}_{CL}$ is zero. Since there is no complementary clock current $\bar{I}_{CL}$, the transistors 31 and 32 are inoperative and are omitted from the schematic. During this unlatched state, the input pair of transistors 11 and 12 and the transistors 15 and 25 operate to amplify and limit the input signals applied to the input terminals 13. With respect to large amplitude input signals, the transistors 11, 12, 15 and 25 operate nonlinearly but not in saturation. The unlatched state is the state of operation of the circuit 10 during which new data is applied to the input. In the unlatched state, the latch circuit 10 acts like a quantizer. Output signals are a quantized version of the input signals and are produced at the output terminals 30. Thus the state of the input data signal which is applied to the input terminals 13 is quantized by the input transistors 11 and 12 and are mirrored to the output terminals 30 by way of transimpedance circuits.

Figure 3:
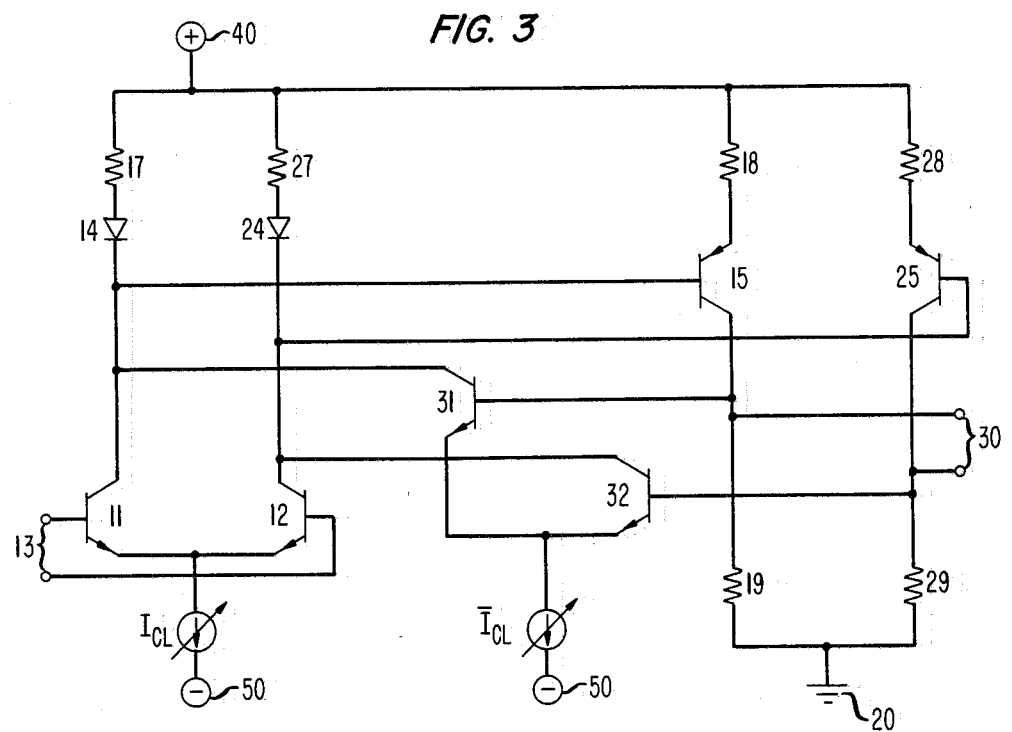

Referring now to FIG. 3, there is shown the schematic of the effective circuit of FIG. 1 during the dynamic state. The three pairs of transistors are shown separated from one another for clarity. The dynamic state occurs while the clock currents $I_{CL}$ and $\bar{I}_{CL}$ are in transition from the unlatched condition wherein the clock current $I_{CL}$ is at maximum amplitude and the complementary clock current $\bar{I}_{CL}$ is zero to the latch, or opposite, clock current condition. Thus a decreasing clock current $I_{CL}$ is conducted through the common emitter circuits of the transistors 11 and 12. An increasing complementary clock current $\bar{I}_{CL}$ is conducted through the common emitter circuits of the feedback transistors 31 and 32. Both of the clock currents $I_{CL}$ and $\bar{I}_{CL}$ are shown as varying currents in FIG. 3.

This dynamic state provides an interval during which the new data, applied to the input during the unlatched state, is latched into the latch circuit 10. Current mirror arrangements of the opposite conductivity type transimpedance circuits, change the polarity of the collector output currents from the input pair of emitter-coupled transistors. Storage time of the transimpedance circuit arrangements is sufficiently long to assure that the latch circuit 10 retains the state of the new data while the clock currents are switched from the unlatched state to the latched state. During the dynamic state, all of the transistors 11, 12, 15, 25, 31 and 32 are operated under various operating conditions because the varying clock currents dynamically change the bias conditions. The clocked latching circuit 10 decides during the dynamic state whether the input signal represents a one or a zero bit.

Figure 4:
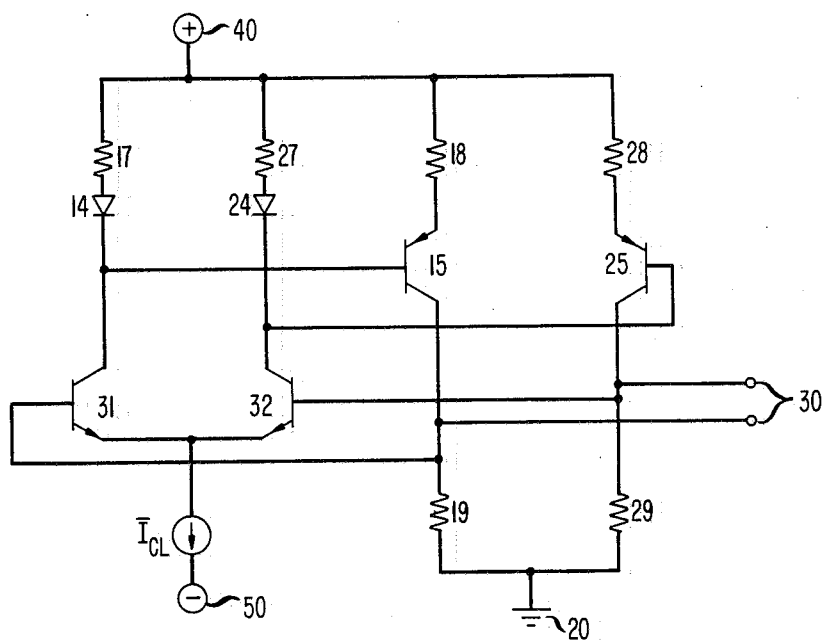

Referring now to FIG. 4, there is shown a schematic of the effective parts of the circuit of FIG. 1 during the latched, or regenerative, state. The feedback pair of transistors 31 and 32 is separated from the transistors 15 and 25 for clarity. The latched, or regenerative, state occurs while the complementary clock current $\bar{I}_{CL}$ has a maximum steady state magnitude while the clock current $I_{CL}$ is zero. During this latched state, the input pair of emitter-coupled transistors 11 and 12 is inoperative because there is no clock current $I_{CL}$ supplied to their common emitter circuit. The transistors 11 and 12 therefore are omitted from the schematic. The transistors 15 and 25 and the feedback pair of transistors 31 and 32 operate in a regenerative, or latched, state with respect to the signal stored at the output terminals 30 upon the termination of the unlatched state. Throughout the latched state, these signals are retained by the regenerative action of the transimpedance circuits and the latching pair of transistors 31 and 32.

Whatever state is latched into the clocked latching circuit 10, causes complementary output signals to be produced on the output terminals 30 and held for application to any circuit connected to those terminals. These output signals may be used as single-ended or as balanced output signals.

It is noted that the conductivities of the transistors can be interchanged. Care must be taken to alter polarities accordingly throughout the circuit.

It is advantageous to fabricate the latching circuit 10 as an integrated circuit. There are known processes for fabricating the opposite conductivity type transistors in a monolithic integrated circuit capable of operating at frequencies as high as the microwave frequency range. One process which can be used for making the circuit is a process described in a now abandoned U.S. patent application Ser. No. 658,586, filed on Feb. 17, 1976 in the names of W. E. Beadle, S. F. Moyer, and A. A. Yiannoulos and entitled "Integrated Complementary Vertical Transistors." Another process which can be used for making the circuit is a slightly modified version of the just mentioned process, which is described in a U.S. patent application, Ser. No. 337,707, filed on Jan. 7, 1982 in the name of D. G. Ross.

The foregoing describes an illustrative embodiment of the invention. The described embodiment together with other embodiments which are obvious to those skilled in the art are considered to be within the scope of the invention.

What is claimed is:

1. A digital latching circuit comprising
    a quantizer having an input pair of emitter-coupled transistors of a first conductivity type connected to output transimpedance circuits, each of said output transimpedance circuits having an input and an output and including transistors of a second conductivity type, the quantizer being responsive to the state of an input signal applied to the input pair of producing from the output transimpedance circuits a quantized output signal,
    a feedback pair of emitter-coupled transistors of the first conductivity type, each one of said feedback transistors being interposed between the output of a respective one of said transimpedance circuits and the input of that same transimpedance circuit for coupling output signals of that transimpedance circuit to the input of that same transimpedance circuit, and
    a clock source for applying clock current pulses alternatively to the coupled emitter circuits of the input pair and of the feedback pair for alternatively enabling the quantizing of the state of the input signal and the latching of that quantized state.

2. A digital latching circuit in accordance with claim 1 wherein the input pair of emitter-coupled transistors, the output transimpedance circuits and the feedback pair of emitter-coupled transistors are operated always in a nonsaturated condition.

3. A digital latching circuit in accordance with claim 2 wherein the input pair of emitter-coupled transistors, the output transimpedance circuits and the feedback pair of emitter-coupled transistors are operable at frequencies as high as microwave frequencies.

4. A digital latching circuit in accordance with claim 3 wherein storage time of the transimpedance circuits assures retention of an existing state of the transimpedance circuits when a clock current pulse changes said digital latching circuit from an unlatched state to a latched state.

5. A digital latching circuit in accordance with claim 4 wherein a source of bias voltage is connected to the transimpedance circuits, the feedback pair of emitter-coupled transistors and the transistors of the transimpedance circuits are interconnected with the base-collector junction of each transistor in said feedback pair of transistors connected in parallel with the base-collector junction of the transistor of its respective transimpedance circuit, thereby causing the output voltage signals to be independent of said bias voltage over a wide range.

6. A digital latching circuit for quantizing and latching the quantized values present in an output signal, said circuit comprising first and second pairs of emitter-coupled transistors each transistor of which is of a first conductivity type and has emitter, base, and collector electrodes;

means for coupling said input signal to the base electrodes of said first pair of emitter-coupled transistors;

a pair of transimpedance circuits each one of which has an input and an output and a transistor of opposite conductivity type;

means for coupling each collector electrode of said first pair of emitter-coupled transistors to a different collector electrode of said second pair of emitter-coupled transistors and to the input of a different transimpedance circuit;

means for coupling the output of each of said pair of transimpedance circuits to the base electrode of the respective transistor of said second pair of emitter-coupled transistors to which its input is connected; and a clock source for applying clock current pulses alternately to the emitter electrodes of said first pair of emitter-coupled transistors and to the emitter electrodes of said second pair of emitter-coupled transistors, thereby causing the digital latching circuit to alternately quantize said input signal and latch the quantized value.

* * * * *